United States Patent [19]
Little

[11] Patent Number: 6,140,811
[45] Date of Patent: *Oct. 31, 2000

[54] HAND-HELD MEASUREMENT DEVICE COMBINING TWO LOGIC LEVEL INDICATORS

[75] Inventor: Douglas Little, Fort Collins, Colo.

[73] Assignee: Agilent Technologies, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/906,609

[22] Filed: Aug. 5, 1997

Related U.S. Application Data

[63] Continuation-in-part of application No. 08/841,222, Apr. 29, 1997, abandoned.

[51] Int. Cl.[7] .................................................. G01R 29/12
[52] U.S. Cl. ........................................................... 324/115
[58] Field of Search ...................... 324/133, 556, 324/115, 121 R, 114; 340/649, 650, 660, 661

[56] References Cited

U.S. PATENT DOCUMENTS

| | | | |
|---|---|---|---|
| 3,667,037 | 5/1972 | Kierce | 324/72.5 |
| 4,225,817 | 9/1980 | Kahlden | 324/133 |
| 4,233,560 | 11/1980 | Blenman | 324/133 |
| 4,321,530 | 3/1982 | Kelly | 324/133 |
| 4,321,543 | 3/1982 | Tuska | 324/433 |
| 4,364,036 | 12/1982 | Shimizu | 324/121 R |
| 4,864,226 | 9/1989 | Tachimoto et al. | 324/115 |
| 4,922,184 | 5/1990 | Rosenstein | 324/72.5 |
| 5,475,300 | 12/1995 | Havel | 324/115 |
| 5,493,208 | 2/1996 | Goto | 324/73.1 |
| 5,508,607 | 4/1996 | Gibson | 324/121 R |
| 5,530,373 | 6/1996 | Gibson | 324/115 |
| 5,705,936 | 1/1998 | Gibson | 324/115 |
| 5,923,161 | 7/1999 | Frankovitch, Jr. et al. | 324/121 R |

*Primary Examiner*—Safet Metjahic
*Assistant Examiner*—Vincent Q. Nguyen
*Attorney, Agent, or Firm*—Patrick J. Murphy

[57] ABSTRACT

A handheld measurement device combines a logic probe, a timing analyzer, a voltmeter and a continuity detector. The measurement device provides a visual logic level indicator with an audible logic level indicator. Three channels are provided, each with simultaneous combinational triggering, to facilitate the analysis of signal timing. The device provides simultaneous measurements from a single probe.

10 Claims, 10 Drawing Sheets

HAND-HELD MEASUREMENT DEVICE COMBINING TWO LOGIC LEVEL INDICATORS

This application is a Continuation In Part (CIP) of Ser. No. 08/841,222, filed Apr. 29, 1997, now abandoned.

FIELD OF THE INVENTION

The present invention relates generally to test and measurement instruments and more particularly to a handheld measurement device comprising logic and timing analysis features, voltage measurement features and a continuity detector.

BACKGROUND OF THE INVENTION

Circuit testing is an important part of circuit development. There are many instruments that are available to perform the testing function, including digital multimeters, oscilloscopes and logic analyzers. With product development and introduction cycles becoming shorter, finding faults earlier in the system design and manufacturing stages is paramount.

However, "in-house" testing, or testing during design and manufacturing stages, is only one part of circuit testing. Testing of circuits is also required after the product has been sold and installed at customer premises. In such field situations a portable and easily configurable in-circuit test system is required. Typically testing in such situations employs oscilloscopes, logic analyzers, and/or multimeters. These instruments are carried to the laboratory or into the field and are connected to the circuit board via test clips connected to wires attached to the test equipment. One problem with this scenario is that most test equipment is too cumbersome to be carried around for general purpose testing.

Logic analyzers are high speed devices that detect and record logic changes in circuits. These devices are most useful for examining multiple signals simultaneously. A logic analyzer can be, for example, connected to the digital bus of a system to read address information on the bus and provide a digital indication of either or both the address and the information associated with the address. For instance, in a digital system using a microprocessor, various diagnostic system tests can be performed with a logic analyzer intercepting the flow of information within the system. One problem with currently available logic analyzers is that they are large and expensive, especially those that use an oscilloscope to display the encoded information. Another problem is these devices are too sophisticated, and as a result, are too complex and expensive to be used for simple circuit testing.

SUMMARY OF THE INVENTION

The present invention provides a handheld measurement device that combines a logic probe, a timing analyzer, a voltmeter and a continuity detector for troubleshooting fine-pitch digital circuitry. The device provides data to the end-user audibly with different beeper tones for high and low conditions, as well as visually with graphic timing displays and blinking LEDs. A display mechanism shows a simultaneous display of multiple measurements in both analog and digital formats. Three separate input channels are provided, with simultaneous combinational triggering.

DETAILED DESCRIPTION OF THE PREFERRED EMBODIMENT

Figure 1:
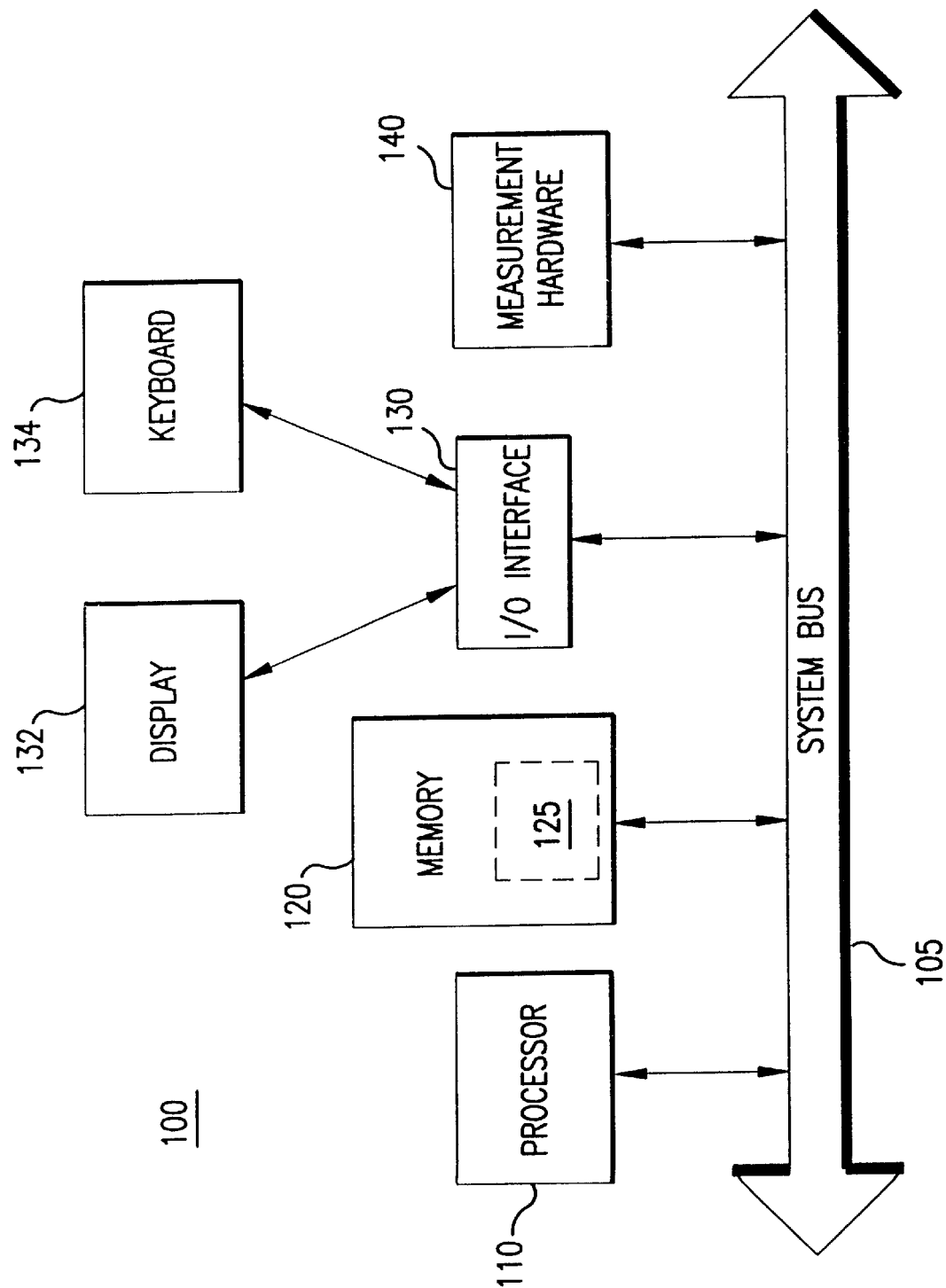
FIG. 1 shows an overall system block diagram.

FIG. 1 shows an overall system block diagram. A processing unit 110 is connected to system bus 105. In a preferred embodiment, the processing unit is an 80L188EB central processing unit available from Intel Corporation. The system bus 105 facilitates communications between the processing unit 110, memory 120, an input/output interface device 130 and measurement hardware 140. The memory 120 may store the software of the present invention as well as all data collected and generated by the present invention. An area 125 within the memory 120 is set aside for storage of the present method which is described more fully below. The input/output interface device 130 controls data communications between the bus 105 and a display mechanism 132, and a keyboard 134.

Figure 2:
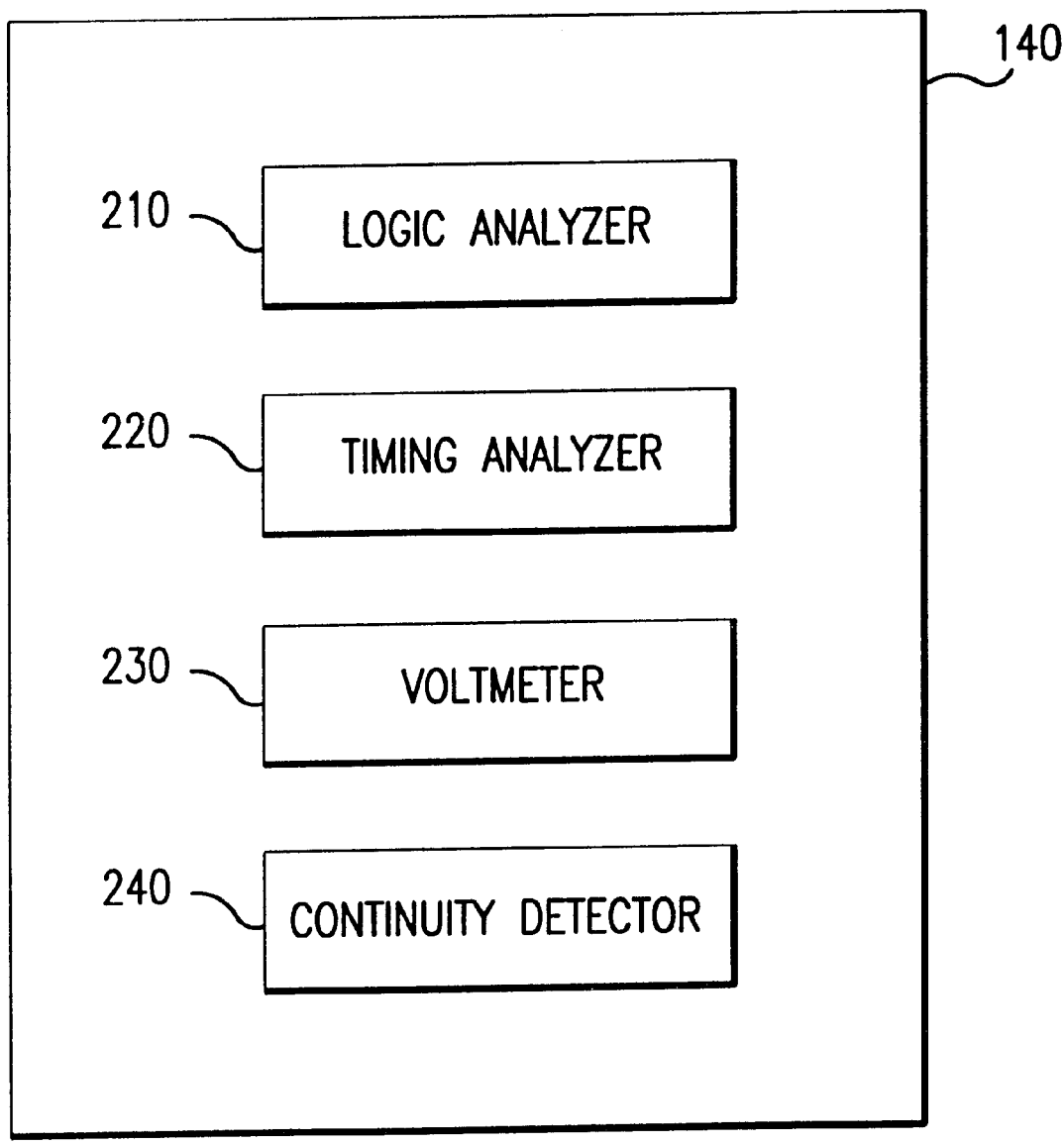
FIG. 2 shows a block diagram of the measurement hardware.

FIG. 2 shows a block diagram of the measurement hardware. Included in the present invention are a logic probe 210, a timing analyzer 220, a voltmeter 230 and a continuity detector 240. All of the measurement hardware is available from a single probe port channel (channel 1). From channel 1, an end-user may capture and examine a logic signal at a particular point in the circuit under test, as well as the voltage and frequency which are both continuously updated. The timing diagram that is displayed shows the captured data for channel 1 as high (logic 1), low (logic 0) or tristate. A feature of the present invention is that the system 100 provides simultaneous acquisition and display of multiple measurements in both graphic and numeric formats. Additional probe ports are also provided so that the end-user may capture and examine a plurality of circuit sections at the same time.

Figure 3:
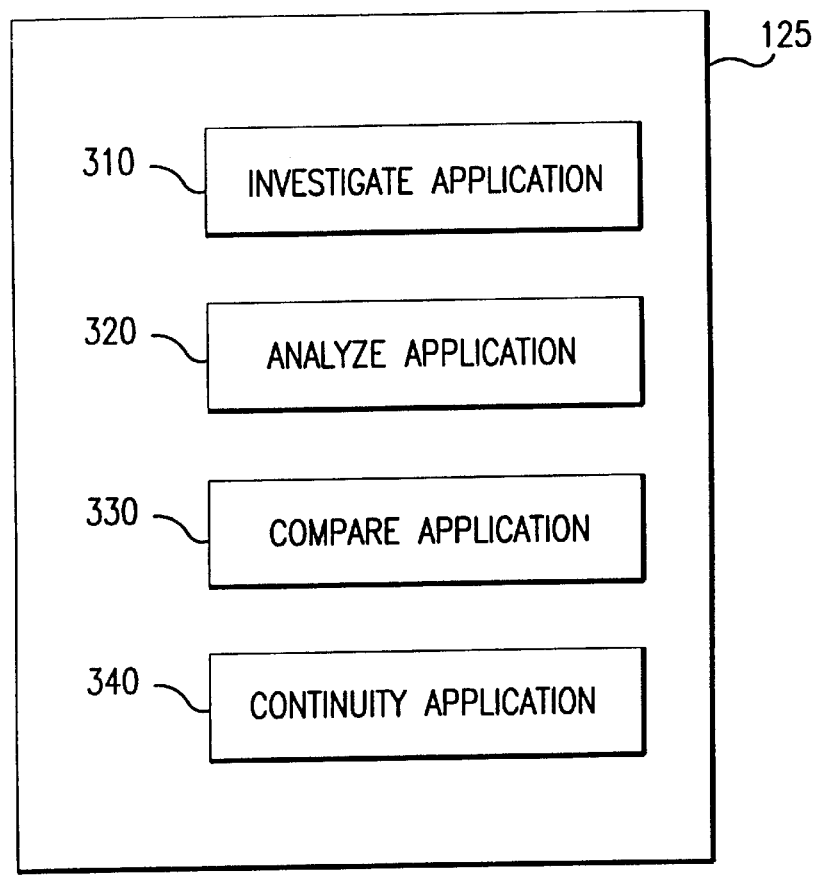
FIG. 3 shows a block diagram of the software applications according to the present invention.

FIG. 3 shows a block diagram of the software applications according to the present invention. Included in the present invention are an investigate application 310, an analyze application 320, a compare application 330 and a continuity application 340. Using the investigate application 310, the end-user may capture and examine any single point within the circuit under test. Using the analyze application 320, the end-user may capture and examine multiple signals from the same circuit utilizing up to three probe port channels. Additionally, complex trigger combinations may be set for the three channels simultaneously. Using the compare application 330, an end-user may compare a waveform to a known "good" waveform. The display mechanism 132 will show the reference waveform, the compared waveform and the differences between the two. Using the continuity application 340, an end-user may examine whether the circuit under test is open or shorted, as well as measure resistance.

Figure 4:
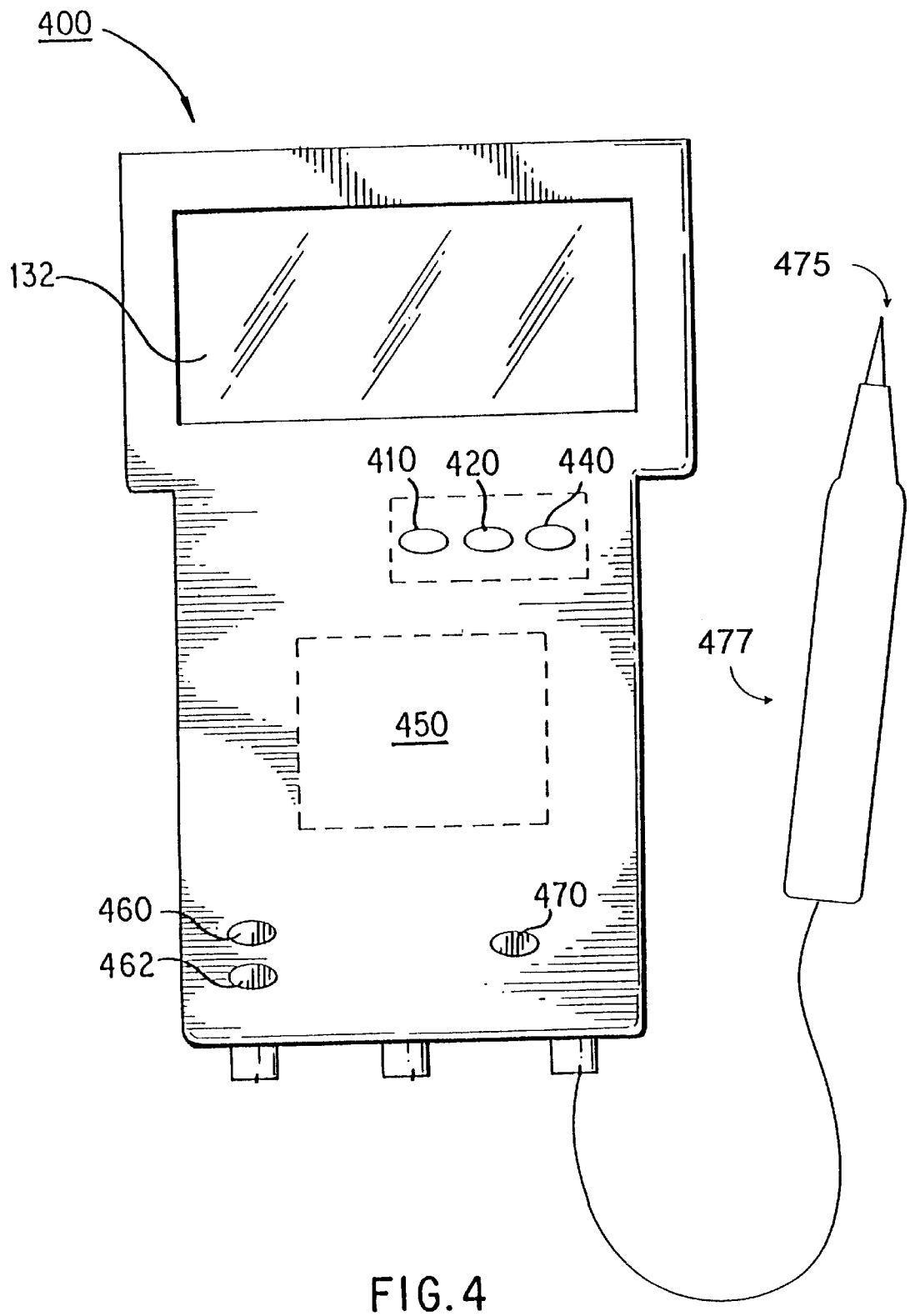
FIG. 4 shows one embodiment of the handheld measurement device according to the present invention.

FIG. 4 shows one embodiment of the handheld measurement device according to the present invention. The display 132 is an LCD. Compare functionality is provided by three push buttons, 410, 420 and 430. An area 450 provides scanning capabilities with scroll buttons (not shown), a one-touch help button and a save button for example. LEDs 460, 462 and 470 provide visual feedback to the end-user. The voltage at channel 1 is above the threshold when LED 460 is on, below the threshold when LED 462 is on and between the high and low thresholds when both LEDs 460, 462 are off. LED 470 is indicative of when channel 1 has found an open.

Figure 5:
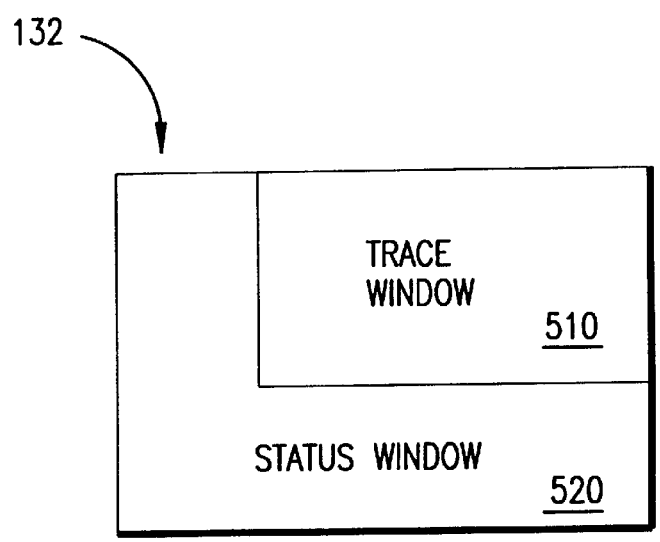
FIG. 5 shows the screen layout of the LCD according to the present invention.

FIG. 5 shows the screen layout of the LCD according to the present invention. In one preferred embodiment, the LCD 132 is a 131×64 pixel display. Other pixel displays could be used, for example 240×160, without departing from the scope of the present invention. The LCD controller (not shown) shifts 256 bits of column data while the row is programmable to 80 or 160 multiplexed rows. An adjustable horizontal scroll trace window 510 is disposed in the upper right corner of the LCD 401, while a fixed (i.e., non-scrolling) status window 520 is disposed below and to the left of trace window 510. Of course, trace window 510 could be disposed in the lower left corner of the LCD 132 or elsewhere without departing from the scope of the present invention.

Two registers specify the (x,y) coordinate of the trace window 510, offset from the (0,0) coordinate of the upper left corner of the LCD 401. The LCD controller is programmed with the starting address for the status and trace bitmaps. The SRAM 1012 is divided into four equally-sized regions, each of size 64K×8 bits. In a preferred embodiment, the bitmaps cannot cross over these bank boundaries.

Figure 6A:
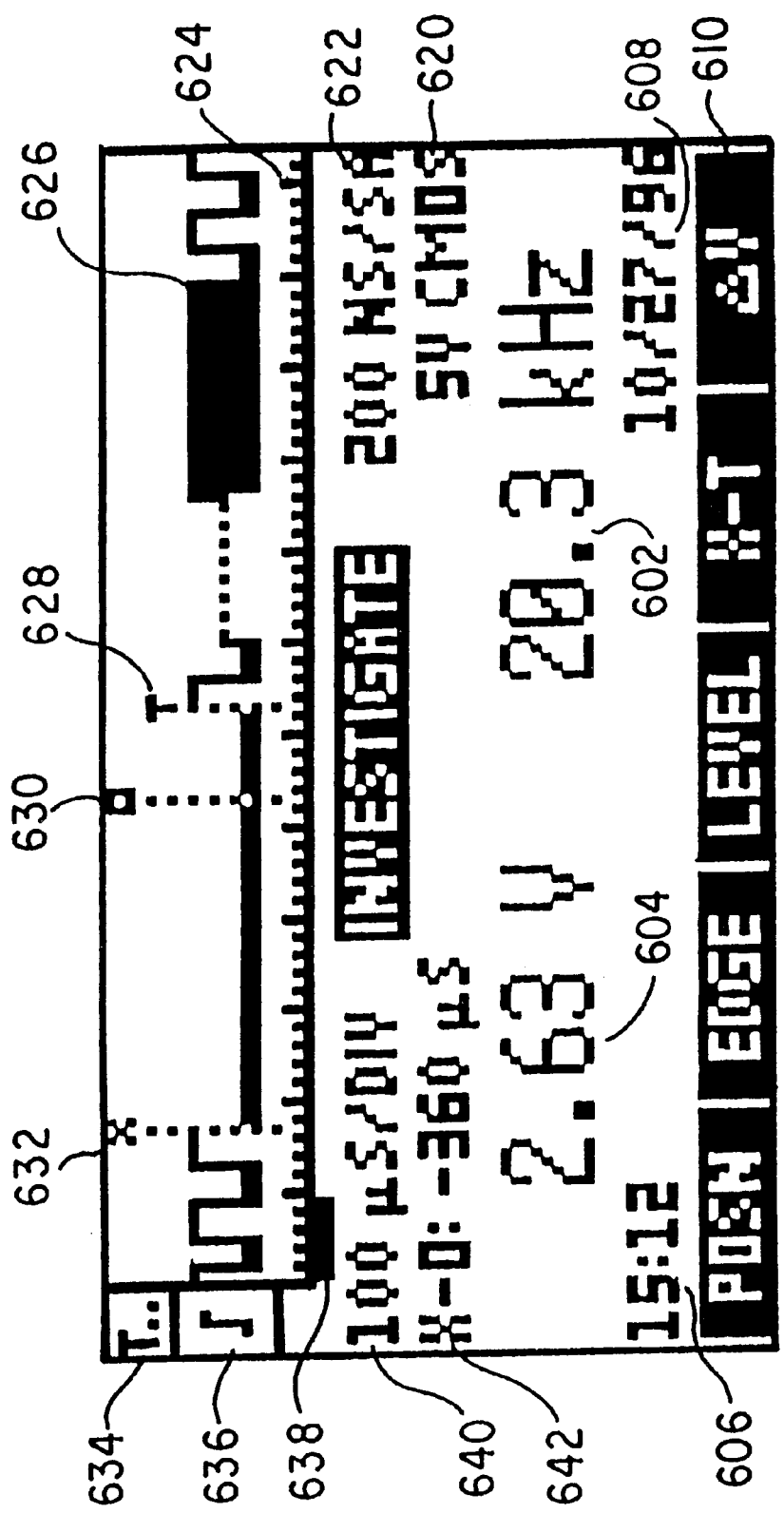
FIGS. 6a and 6b show representative screen displays of the investigate application.
Figure 6B:
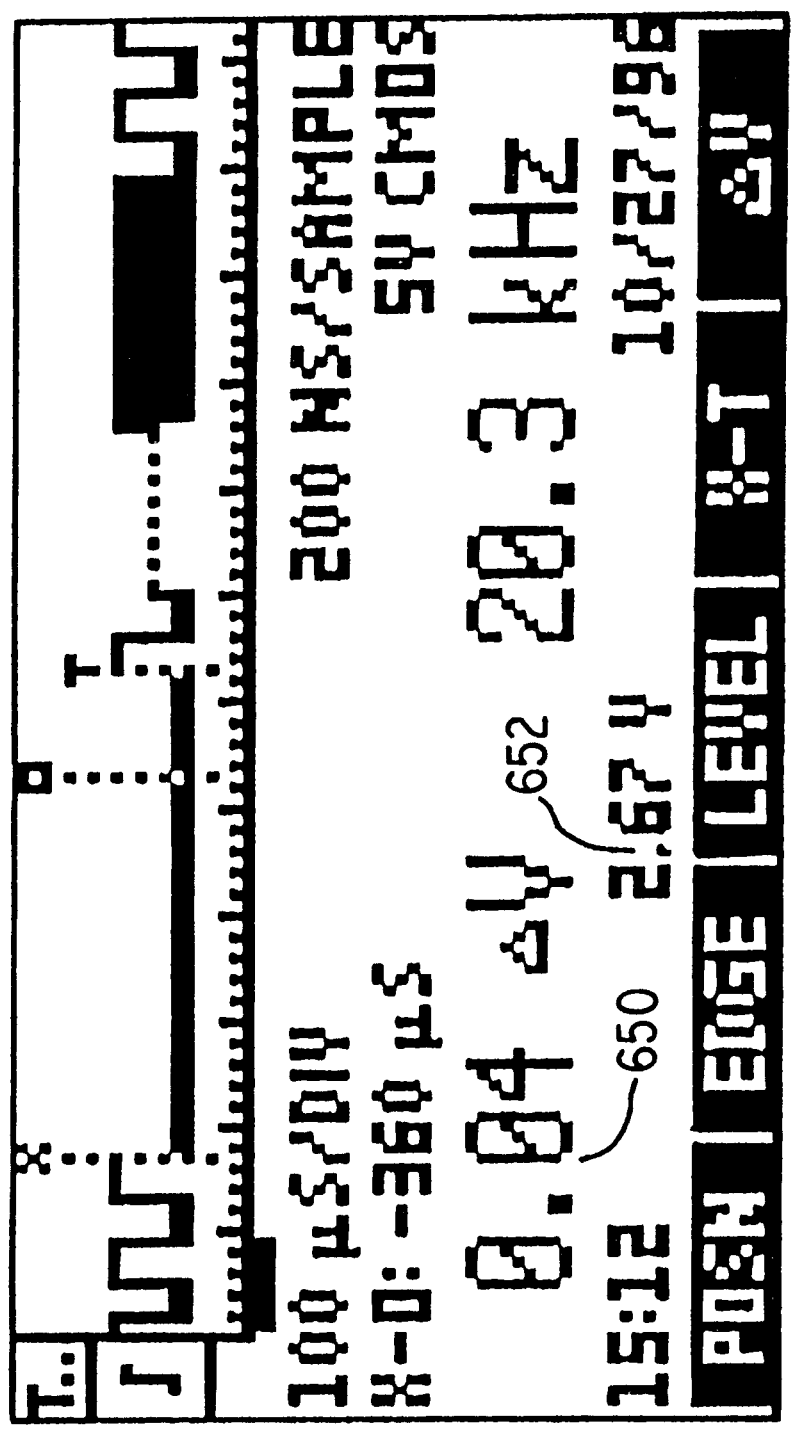

FIGS. 6a and 6b show representative screen displays of the investigate application. The investigate application permits the end-user to view voltages 604, frequencies 602 and waveforms 626 at the channel 1 probe tip. The waveform may be captured and displayed once (this is known as "single-shot" operation). Another embodiment of the present invention contemplates the waveform being captured and displayed continuously.

Referring now to FIGS. 4 and 6a, the voltage 604 displayed represents the voltage at the channel 1 probe tip 475 (i.e., not the average of the displayed waveform). In one preferred embodiment, voltage measurement updates occur 20 times per second. Other update rates can be used without departing from the scope of the present invention. Measured voltages are in the range of −35.00 V to +35.00 V. Voltages outside this range are displayed as either "<−35 V" or ">35 V". Note that if the probe tip 475 is not in contact with a circuit, the "OPEN" message is displayed.

A feature of the present invention is the ability to perform voltage-difference measurements ($\Delta V$). Referring now to FIG.6b, $\Delta V$ 650 shows the difference between a reference voltage and the channel 1 probe tip voltage. A $\Delta V$ function key is provided to facilitate this procedure. Once the $\Delta V$ function key is pressed, the voltage presently at the probe tip is captured and stored as the reference voltage. Subsequently, the voltage field begins to display $\Delta V$. The actual voltage is also displayed (item 652). Once activated, $\Delta V$ may be turned off by either pressing the $\Delta V$ function key or by turning off the device.

Frequency measurements may also be made by the handheld measurement device within the investigate application. The frequency 602 displayed is that of the signal at the channel 1 probe tip 475 (i.e., not necessarily the frequency of the displayed waveform). In one preferred embodiment, updates to the frequency measurement occur twice every second. Frequency is measured by counting falling edges with the timing analyzer. Other methods for determining frequency, such as counting rising edges, may be used without departing from the scope of the present invention.

Figure 7:
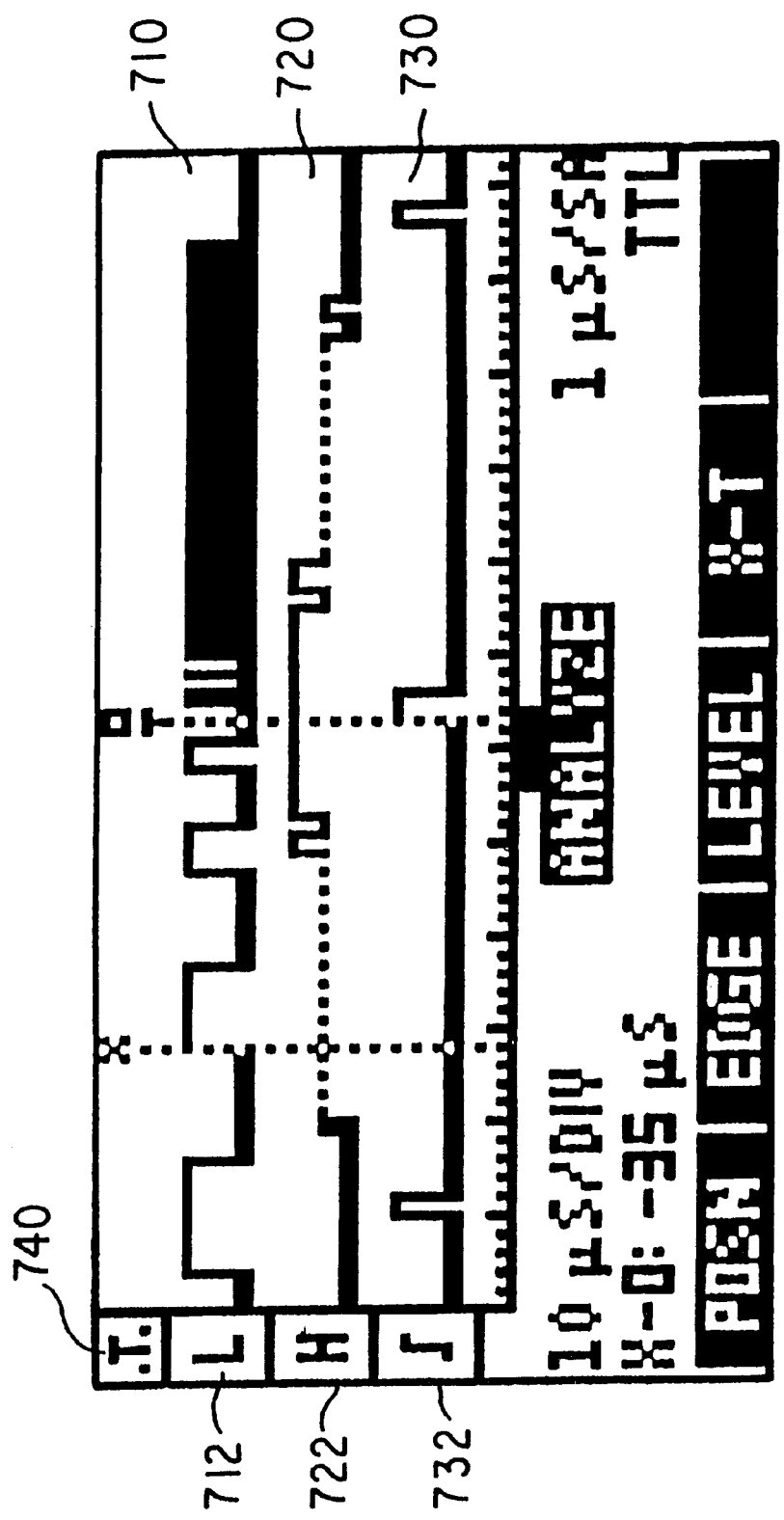
FIG. 7 shows a representative screen display of the analyze application.

FIG. 7 shows a representative screen display of the analyze application. The analyze application provides the capability to capture and view up to three waveforms simultaneously 710,720,730. Trigger conditions 712,722, 732 can be set for all three channels. The end-user may first select the trigger position. Once pressed, the POSN menu key displays a choice of three trigger positions (item 740): (1) "T.." [left trigger position, which focuses on an area of the waveform following the trigger point]; (2) ".T." [center trigger position, which focuses on an area of the waveform around the trigger point]; and (3) "..T" [right trigger position, which focuses on an area of the waveform preceding the trigger point].

Next, the end-user may select either EDGE or LEVEL to select the trigger type. The EDGE trigger type may be a rising edge trigger, a falling edge trigger or a rising-or-falling edge trigger. The LEVEL trigger type may be a high level trigger, a low level trigger or a don't-care trigger. When the waveform capture commences, the trigger conditions are checked. If the trigger conditions are not met, the trigger type blinks and a message is displayed. In one preferred embodiment, the message is "WAITING FOR TRIGGER" although other messages may be used without departing from the scope of the present invention. Trigger conditions are checked every 10 nanoseconds, regardless of the sample period.

All three waveforms use the same time/div value. The autoscale button (see FIG. 4) automatically determines the time/div and sample period, and captures the waveforms. The channel with the fastest signal is used to set the time/div value. The time base is set to display between 5 and 12 transitions in the display. In a preferred embodiment, the sample period ranges from 10 nanoseconds to 100 milliseconds. The zoom in and zoom out buttons set a shorter time/div and faster sample period, and a longer time/div and slower sample period respectively.

Figure 8:
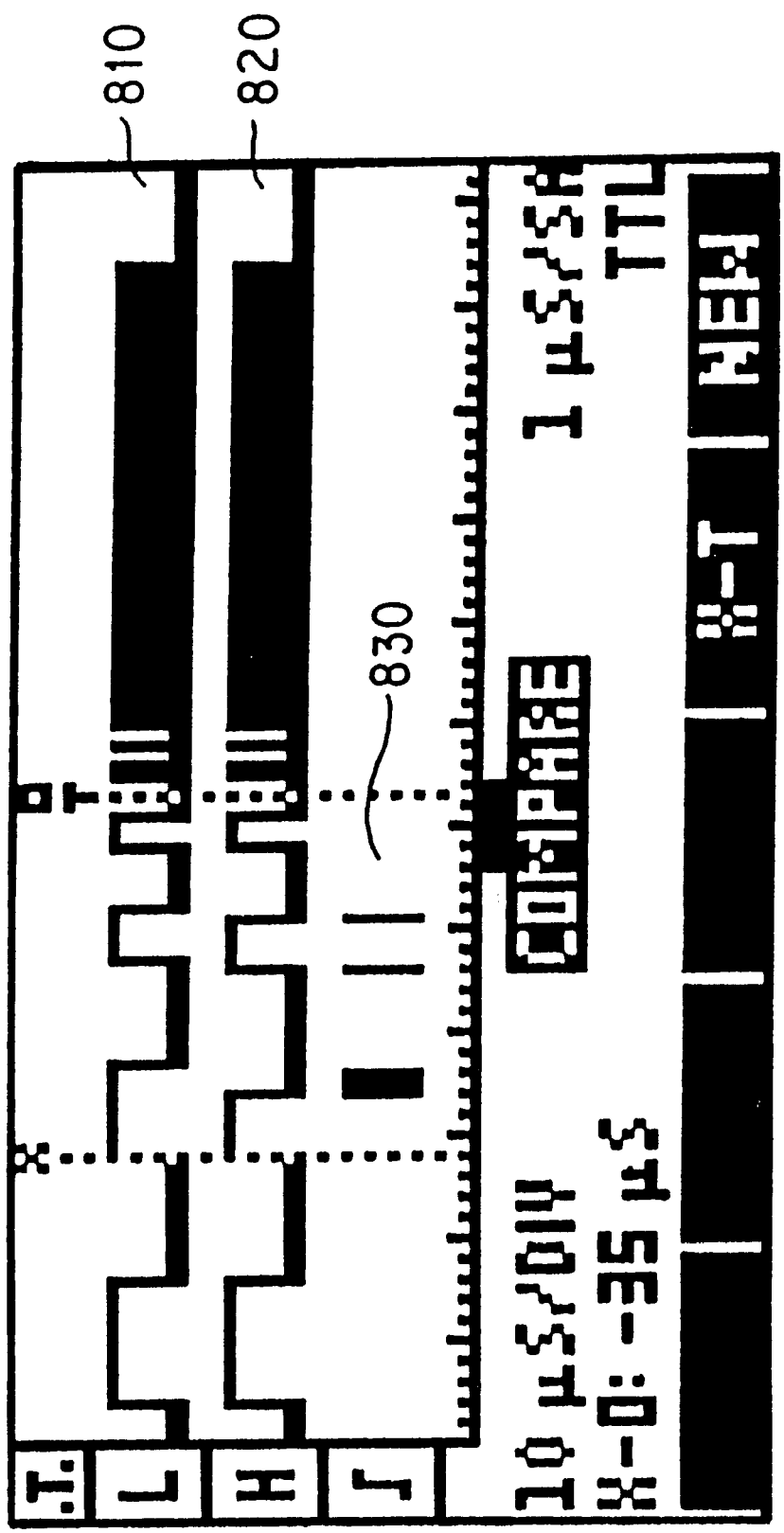
FIG. 8 shows a representative screen display of the compare application.

FIG. 8 shows a representative screen display of the compare application. The compare application provides the capability to compare a known good waveform, or reference waveform 810, to another waveform 820. This function is useful, for example, when turning on multiple circuit boards where a first board is working while a second board is not. A section 830 in the waveform display area shows the differences between the reference waveform 810 and the compared waveform 820. Differences are displayed as vertical lines below where the differences occur. Where a series of adjacent differences occur, a block (or adjacent vertical lines) is displayed.

Figure 9:
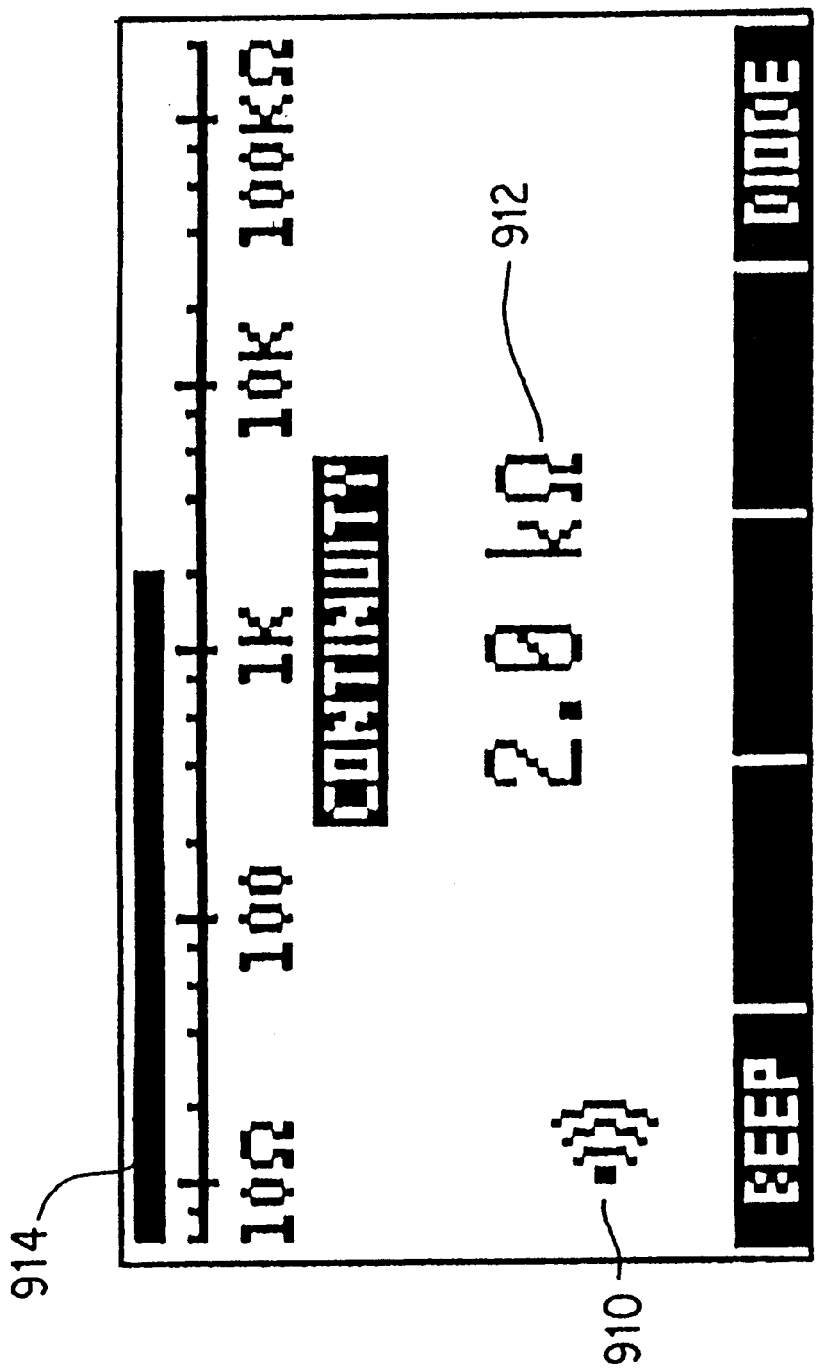
FIG. 9 shows a representative screen display of the continuity application.

FIG. 9 shows a representative screen display of the continuity application. The continuity application provides the capability to test circuits for shorts and opens. The system first checks a resistance threshold, indicating continuity on a go/no-go basis using an audible beeper (not shown), and a continuity LED (see item 470, FIG. 4). Resistance is measured between the channel 1 probe 477 and the ground lead and is displayed numerically 912 and via a bar graph 914. In a preferred embodiment, the continuity beep indicates circuit resistance above or below an 80 Ω threshold.

Figure 10:
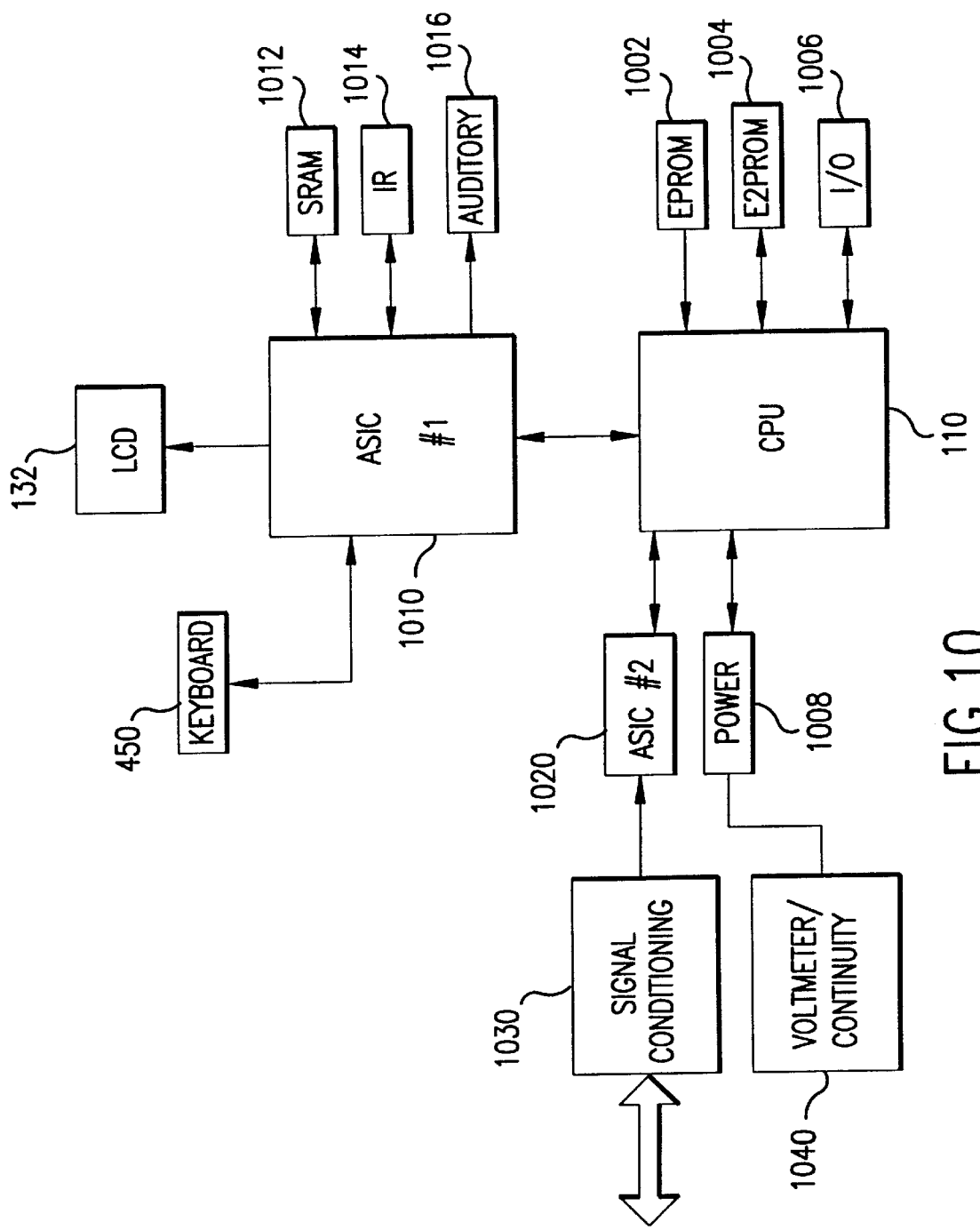
FIG. 10 shows a block diagram of the present system.

FIG. 10 shows a block diagram of the present invention. A CPU 1001 is connected to a first ASIC 1010. An EPROM 1002, an EEPROM 1004 and an input/output interface are also connected to the CPU 1001. A second ASIC 1020 is connected to the CPU 1001 and is disposed between the CPU 1001 and a signal conditioning block 1030 and a voltmeter 1040. Connected to the first ASIC 1010 is an SRAM 1012, a serial infrared port 1014 and an auditory block 1016. The keyboard 450 and LCD 132 are connected to the first ASIC 1010.

The primary function of the first ASIC 1010 is to generate clock, data and address control signals for the interface between the CPU 1001 and the LCD 401. Essentially, the first ASIC 1010 uses display data from the CPU 1001 to create the requisite clocks, and row and column data signals to drive the LCD 401. The first ASIC 1010 also acts as a glue logic collection point for other I/O functions, interfacing between the CPU 1001 and the SRAM 1012. ASIC 1010 also buffers and decodes the user keyboard 450, it drives the audible and visual annunciators 1016 and drives the serial infrared port 1014.

What is claimed is:

1. A hand-held measurement device combining multiple functions, the device having a display mechanism and a speaker, the device comprising:
    memory for storing voltages;
    at least one probe for measuring voltages;
    a first input key, wherein the device, in response to activation of the first input key, is configured to store in the memory a first voltage measured by the at least one probe;
    a second input key, wherein the device is configured to set a trigger condition in response to activation of the second input key;
    a first visual indicator for displaying a value representative of the difference between the reference voltage stored in the memory and a second voltage measured by the at least one probe; and
    a second visual indicator for graphically displaying a waveform measured by the at least one probe via a timing diagram in response to the measured waveform exhibiting a state that satisfies the set trigger condition.

2. The hand-held measurement device of claim 1 wherein the same probe receives the first voltage, the second voltage, and a plurality of other voltages, the plurality of other voltages defining the measured waveform.

3. The hand-held measurement device of claim 1 wherein the first measured voltage is captured during activation of the first input key.

4. The hand-held measurement device of claim 1 further comprising an audible indicator indicative of whether a resistance measured by the at least one probe is above a threshold.

5. The hand-held measurement device of claim 4 wherein the first visual indicator and the audible indicator are both driven by an ASIC.

6. The hand-held measurement device of claim 5 wherein the first visual indicator comprises at least two LEDs.

7. A method for analyzing electrical circuits, comprising the steps of:
    providing a measurement device, the measurement device having a memory, a first input key, a second input key, a first visual indicator, a second visual indicator, and at least one probe;
    measuring via the at least one probe a first voltage, a second voltage, and a plurality of other voltages to respectively produce a first measured voltage, a second measured voltage, and a plurality of measured voltages;
    activating the first input key;
    storing the first measured voltage in the memory in response to the activating the first input key step;
    activating the second input key;
    setting a trigger condition in response to the activating the second input key step;
    displaying a value representative of a difference between the first measured voltage and the second measured voltage via the first visual indicator;
    detecting when the plurality of measured voltages satisfies the set trigger condition; and
    graphically displaying the plurality of measured voltages with the second visual indicator via a timing diagram in response to the detecting step.

8. The method of claim 7 wherein the at least one probe includes a tip, and wherein the measuring step further includes the step of receiving the first voltage, the second voltage, and the plurality of other voltages at the tip.

9. The method of claim 7 wherein the at least one probe includes a tip, the first measured voltage being a voltage at the tip when the activating the first input key step is performed.

10. The method of claim 7; further comprising the steps of:
    producing an audible sound; and
    indicating, via the audible sound, whether a resistance measured by the at least one probe is above a threshold.

* * * * *